US012755809B2

(12) United States Patent
Fujii

(10) Patent No.: US 12,755,809 B2
(45) Date of Patent: Oct. 6, 2026

(54) SEMICONDUCTOR DEVICE, SEMICONDUCTOR DEVICE TESTING APPARATUS AND SEMICONDUCTOR DEVICE TESTING METHOD

(71) Applicant: Renesas Electronics Corporation, Tokyo (JP)

(72) Inventor: Kuninobu Fujii, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 133 days.

(21) Appl. No.: 18/658,275

(22) Filed: May 8, 2024

(65) Prior Publication Data

US 2025/0349380 A1 Nov. 13, 2025

(51) Int. Cl.
*G11C 29/56* (2006.01)

(52) U.S. Cl.
CPC .. *G11C 29/56004* (2013.01); *G11C 29/56016* (2013.01); *G11C 2029/5602* (2013.01)

(58) Field of Classification Search
CPC ........ G11C 29/56004; G11C 29/56016; G11C 2029/5602
See application file for complete search history.

(56) References Cited

U.S. PATENT DOCUMENTS 8,456,931 B2 * 6/2013 Ku .................... G11C 29/1201 365/201
2012/0275246 A1 * 11/2012 Kim .................. G11C 29/1201 365/194

FOREIGN PATENT DOCUMENTS

JP 2009-133629 A 6/2009

* cited by examiner

*Primary Examiner* — Mohammed A Bashar
(74) *Attorney, Agent, or Firm* — Rimon P.C.

(57) ABSTRACT

A semiconductor device includes a central processing unit (CPU), a memory, a test data input terminal that receive test data, a test group identification terminal that receive a test group identification signal, a test data input control unit that receives the test group identification signal through the test group identification terminal and generates a memory write enable signal for allowing the test data to be written into the memory based on the test group identification signal, and a memory write control circuit that generates test data write address and selects the test data received through the test data input terminal based on the memory write enable signal to transfer the test data selected and the test data write address to the memory, whereby a test with the test data in the memory is executed.

5 Claims, 7 Drawing Sheets

SEMICONDUCTOR DEVICE, SEMICONDUCTOR DEVICE TESTING APPARATUS AND SEMICONDUCTOR DEVICE TESTING METHOD

BACKGROUND

The present disclosure relates to a semiconductor device testing apparatus, and can be suitably used, for example, for a semiconductor device testing apparatus that simultaneously tests a plurality of semiconductor devices.

A semiconductor device testing apparatuses that simultaneously tests a plurality of devices with a plurality of test items are known. The semiconductor device testing apparatus supplies source current to the plurality of devices. Therefore, the number of devices that can be simultaneously tested by the semiconductor device testing apparatus depends on the supply current of the semiconductor device testing apparatus and the current consumed during testing of the devices. For example, Japanese Unexamined Patent Application Publication No. 2009-133629 (Patent Document 1) discloses a semiconductor device testing apparatus in which a plurality of devices are tested by a different combination of test items.

SUMMARY

The semiconductor device testing apparatus of Patent Document 1 installs a program consisting of a test item with high current consumption and a test item with low current consumption and tests the devices according to the installed program. According to such a program, the semiconductor device testing apparatus instructs the test items to be tested to the respective device.

However, in order to instruct test items for each device, the program to be installed in the semiconductor device testing apparatus becomes complicated, which also requires an expensive semiconductor device testing apparatus, which may increase the test cost.

Other objects and novel features will become apparent from the description of this specification and the accompanying drawings.

According to one aspect of the present invention, a semiconductor device includes a central processing unit (CPU), a memory, a test data input terminal that receive test data, a test group identification terminal that receive a test group identification signal, a test data input control unit that receives the test group identification signal through the test group identification terminal and generates a memory write enable signal for allowing the test data to be written into the memory based on the test group identification signal, and a memory write control circuit that generates test data write address and selects the test data received through the test data input terminal based on the memory write enable signal to transfer the test data selected and the test data write address to the memory, whereby a test with the test data in the memory is executed.

According to another aspect of the present invention, a semiconductor device testing apparatus includes a test board for mounting the semiconductor devices, a test memory that stores a test program, a test controller that is configured to execute the test program to generate test signals used for test of the semiconductor devices mounted on the test board, and a power supply circuit that supplies power supply for the semiconductor devices on the test board. The semiconductor devices mounted on the test board are divided into a first test group and a second test group. Each of the semiconductor devices includes a central processing unit (CPU), a memory, a test data input terminal that receives test data, a test group identification terminal that receives a test group identification signal, a test data input control circuit that receives the test group identification signal through the test group identification terminal and generates a memory write enable signal for allowing the test data to be written into the memory based on the test group identification signal, and a memory write control circuit that generates test data write address and selects the test data received through the test data input terminal based on the memory write enable signal to transfer the test data selected and the test data write address to the memory. The test group identification terminals of the semiconductor devices of the first test group are fixed to high level on the test board and the test group identification terminals of the semiconductor devices of the second test group are fixed to low level on the test board.

According to still another aspect of the present invention, a semiconductor device testing method using a semiconductor device testing apparatus simultaneously testing a plurality of semiconductor devices includes transferring a plurality of test data sets associated with a plurality of test items to a plurality of semiconductor devices mounted on a test board from a test controller. A first test data set of the test data sets is stored into a first f test group of the plurality of semiconductor devices through the test board. a second test data set of the test data sets is stored into a second test group of the plurality of semiconductor devices through the test board. The test operation is performed on the first test group of the plurality of semiconductor devices with the first data set and on the second test group of the plurality of semiconductor devices with the second data set in parallel.

According to the aspects, in the semiconductor device testing apparatus, there is no need to create a test program for individually instructing test items to a plurality of semiconductor devices on a test board. This eliminates the need to use expensive testing apparatus and can reduce testing costs.

DETAILED DESCRIPTION

Figure 1:
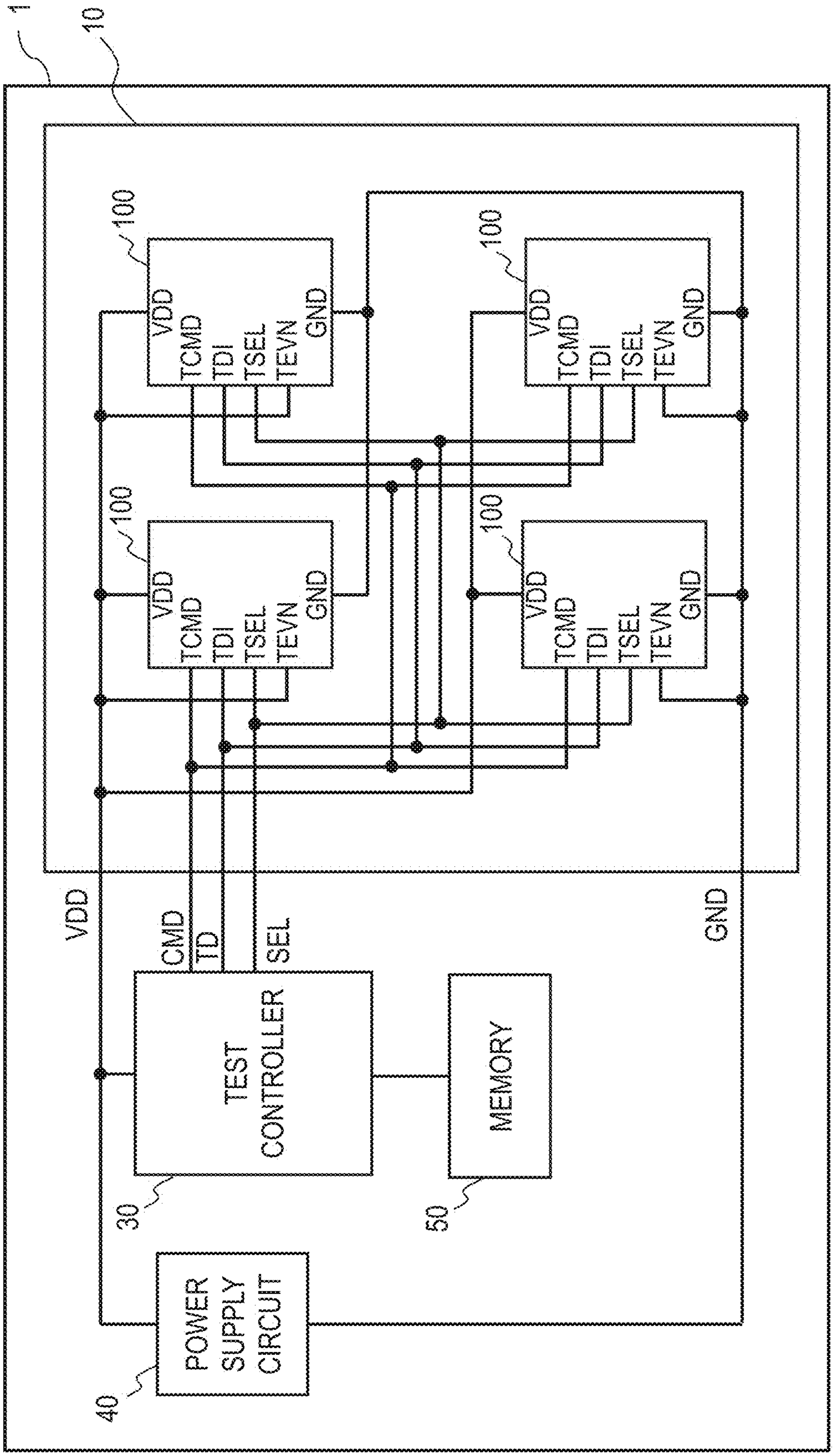
FIG. 1 is a diagram illustrating an exemplary configuration of a semiconductor device testing apparatus according to a first embodiment.

Hereinafter, a semiconductor device testing apparatus according to one or more embodiments will be described referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

Figure 2:
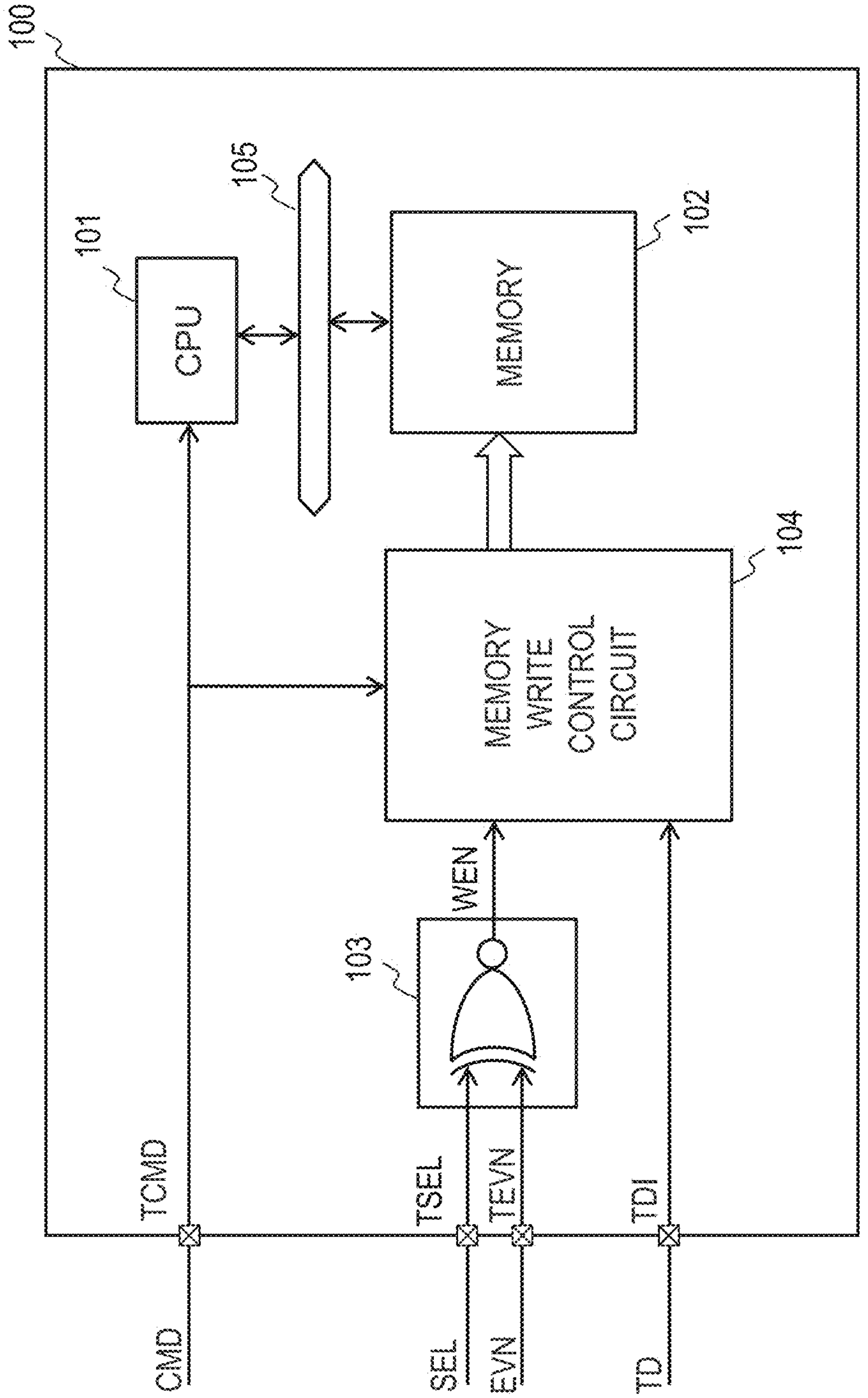
FIG. 2 is a block diagram illustrating a configuration example of a semiconductor device.

FIG. 1 is a block diagram of a semiconductor device testing apparatus 1 according to a first embodiment. FIG. 2 is a diagram showing a configuration of a semiconductor device 100 which is a device under test of the semiconductor device testing apparatus 1 according to the first embodiment.

The semiconductor device testing apparatus 1 shown in FIG. 1 includes a test board 10, a test controller 30, a power supply circuit 40, and a test memory 50.

The test board 10 is a print circuit board that is provided to transmit data necessary for testing, such as test data, to the semiconductor devices 100. The test board 10 has a plurality of sockets (not shown) for mounting a plurality of semiconductor devices 100. The semiconductor devices 100 are attached to the sockets, respectively. That is, the plurality of semiconductor devices 100 are mounted on the test board 10. Although only four semiconductor devices 100 are shown in FIG. 1, the number of semiconductor devices 100 mounted on the test board 10 is not limited thereto.

The test controller 30 controls signals to be transferred to the test board 10 in order to test the plurality of semiconductor devices 100 on the test board 10 in accordance with a test program stored in the test memory 50 provided in the semiconductor device testing apparatus 1. Specifically, the test data TD used in the test of the semiconductor device 100 is outputted. The test data TD outputted from the test controller 30 is supplied to all the semiconductor devices 100 on the test board via wirings on the test board 10. In addition, the test controller 30 generates a command for writing the test data to the semiconductor device 100 and a test data select signal SEL according to the test program and transfers the command and the test data select signal to all the semiconductor devices 100 on the test board 10. The command indicating a test data write instruction given to the semiconductor device 100 is hereinafter referred to as a TDWRITE command.

The power supply circuit 40 supplies power to the plurality of semiconductor devices 100 on the test board 10 during the test. The power supply voltage VDD supplied by the power supply circuit 40 is supplied to all the semiconductor devices 100 mounted on the test board 10 via the power supply voltage wirings on the test board 10. The ground voltage GND supplied by the power supply circuit 40 is supplied to all the semiconductor devices 100 mounted on the test board 10 via the ground voltage wirings on the test board 10.

As shown in FIG. 2, the semiconductor device 100 includes a central processing unit (CPU) 101, a memory 102, a test data input control circuit 103, a memory write control circuit 104, an internal bus 105, a test data input terminal TDI, a test data select input terminal TSEL, a test group identification terminal TEVN, and a test command input terminal TCMD. The semiconductor device 100 is, for example, a microcontroller unit (MCU).

The CPU 101 is connected to the memory 102 via the internal bus 105. The memory 102 is, for example, a dynamic random memory (DRAM) or a static random memory (SRAM), and stores programs and data. The CPU 101 executes processes in accordance with a user program stored in the memory 102.

The test data input control circuit 103 generates a test data write enable signal WEN based on the test data select signal SEL input from the test data select input terminal TSEL and the test group identification signal EVN input from the test group identification terminal TEVN. Specifically, the test data input control circuit 103 includes a comparator that compares the test data select signal SEL and the test group identification signal EVN, and includes, for example, an Exclusive-NOR circuit (hereinafter, referred to as an Ex-NOR circuit) in which the test data select signal SEL and the test group identification signal EVN are input. The test data input control circuit 103 asserts the test data write enable signal WEN as an output when the test data select signal SEL and the test group identification signal EVN coincide with each other, and negates the test data write enable signal WEN when the test data select signal SEL and the test group identification signal EVN do not coincide with each other.

The memory write control circuit 104 controls data write operation of the memory 102. In present embodiment, the memory write control circuit 104 receives a test data write enable signal WEN from the test data input control circuit 103. The memory write control circuit 104 generates a write address for storing the test data in a predetermined storage area of the memory 102 in response to TDWRITE command which is a test data write command. Then, the memory write control circuit 104 selects the test data TD inputted via the test data input terminal TDI while the test data write enable signal WEN is asserted. The memory write control circuit 104 transfers the generated write address and the selected test data TD to the memory 102 in order to write the selected test data TD to a storage area designated by the generated write address. The memory write control circuit 104 has also a function of converting serial data into parallel data, and converts test data TD, which is serial data, into parallel data and sends the parallel data to the memory 102.

Additionally, the semiconductor device 100 has a power supply voltage terminal VDD and a ground voltage terminal GND (not shown). The power supply voltage and the ground voltage are supplied to the internal circuits in the semiconductor device 100 through the power supply voltage terminal VDD and the ground voltage terminal GND.

In present embodiment, the semiconductor device 100 mounted on the test board 10 stores the test data TD transferred from the test controller 30 in the memory 102. When the semiconductor device 100 receives a test execution command, which is a test execution instruction, from the test controller 30, the CPU 101 of the semiconductor device 100 executes the test using the test data stored in the memory 102. Hereinafter, the test execution command is referred to as RUNTEST command.

The plurality of semiconductor devices 100 mounted on the test board 10 are divided into a first test group and a second test group on the test board 10. The test group is distinguished by the test group identification signal EVN inputted to the test group identification terminal TEVN of the semiconductor device 100. The test group identification terminals TEVN of the semiconductor devices 100 belonging to the first test group are connected to the power supply voltage wiring of the test board 10 and is fixed to high level. That is, each the semiconductor device 100 belonging to the first test group receives the high-level test group identification signal EVN. The test group identification terminals TEVN of the semiconductor devices 100 belonging to the second test group are connected to the ground voltage wiring on the test board 10 and is fixed to low level. That is, each semiconductor device 100 belonging to the second test group receives the low-level test group identification signal EVN. Thus, the plurality of semiconductor devices 100 are grouped by being mounted on the test board 10.

Figure 3:
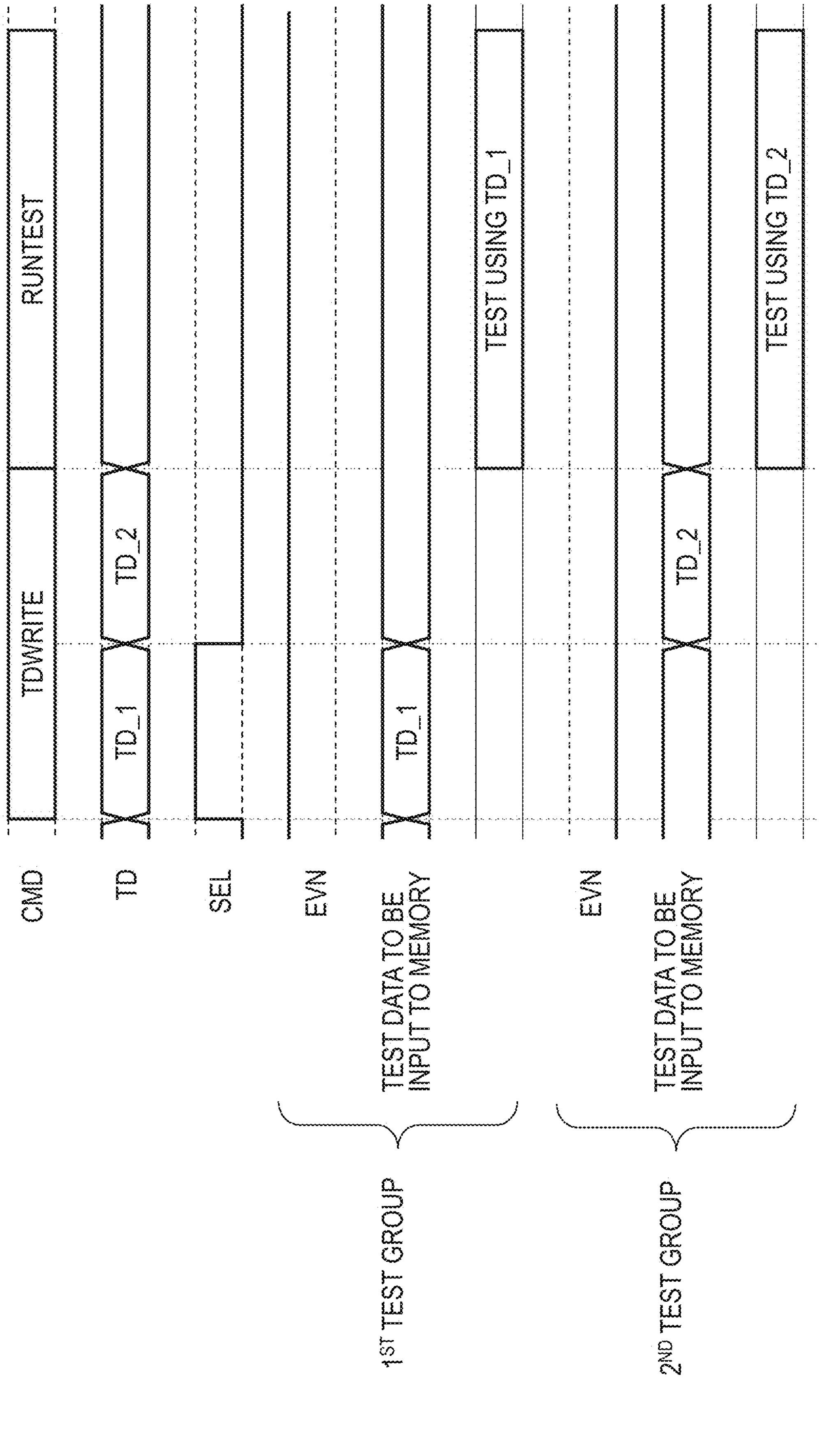
FIG. 3 is a timing diagram illustrating an exemplary test performed by the semiconductor device testing apparatus according to the first embodiment.

FIG. 3 shows a timing diagram of an exemplary test by the semiconductor device testing apparatus 1 in present embodiment. The test controller 30 outputs TDWRITE command according to the test program, and then outputs the test data TD and the test data select signal SEL. The test data TD includes first test data TD_1 and second test data TD_2. For example, the first test data TD_1 is a set of test data for executing a test item having a large current consumption. The second test data TD_2 is a set of test data for performing a test item with low current consumption. The test controller 30 outputs the test data select signal SEL indicating high level while outputting one of the first test data TD_1 and the second test data TD_2. The test data select signal SEL indicates low level while the other of the first test data TD_1 and the second test data TD_2 is outputted. In FIG. 3, the test data select signal SEL output from the test controller 30 indicates high level in a period in which the first test data TD_1 is output, and indicates low level in a period in which the second test data TD_2 is output.

In each semiconductor device 100 of the first test group whose test group identification terminal TEVN is fixed to high level, the test data write enable signal WEN is asserted when the test data select signal SEL indicates high level. Thus, the first test data TD_1 is written to the memory 102 in each semiconductor device 100 of the first test group. On the other hand, in each semiconductor device 100 of the second test group whose the test group identification terminal 110 is fixed to low level, the test data write enable signal WEN is asserted when the test data select signal SEL indicates low level. As a result, the second test data TD_2 is written to the memory 102 in each semiconductor device 100 of the second test group.

Next, the test controller 30 issues RUNTEST command to the semiconductor devices 100 on the test board 10. When receiving RUNTEST command, each semiconductor device 100 executes the test using the test data written to its own memory 102. That is, each semiconductor device 100 of the first test group executes the test with the first test data TD_1, and each semiconductor device 100 of the second test group executes the test with the second test data TD_2.

Figure 4:
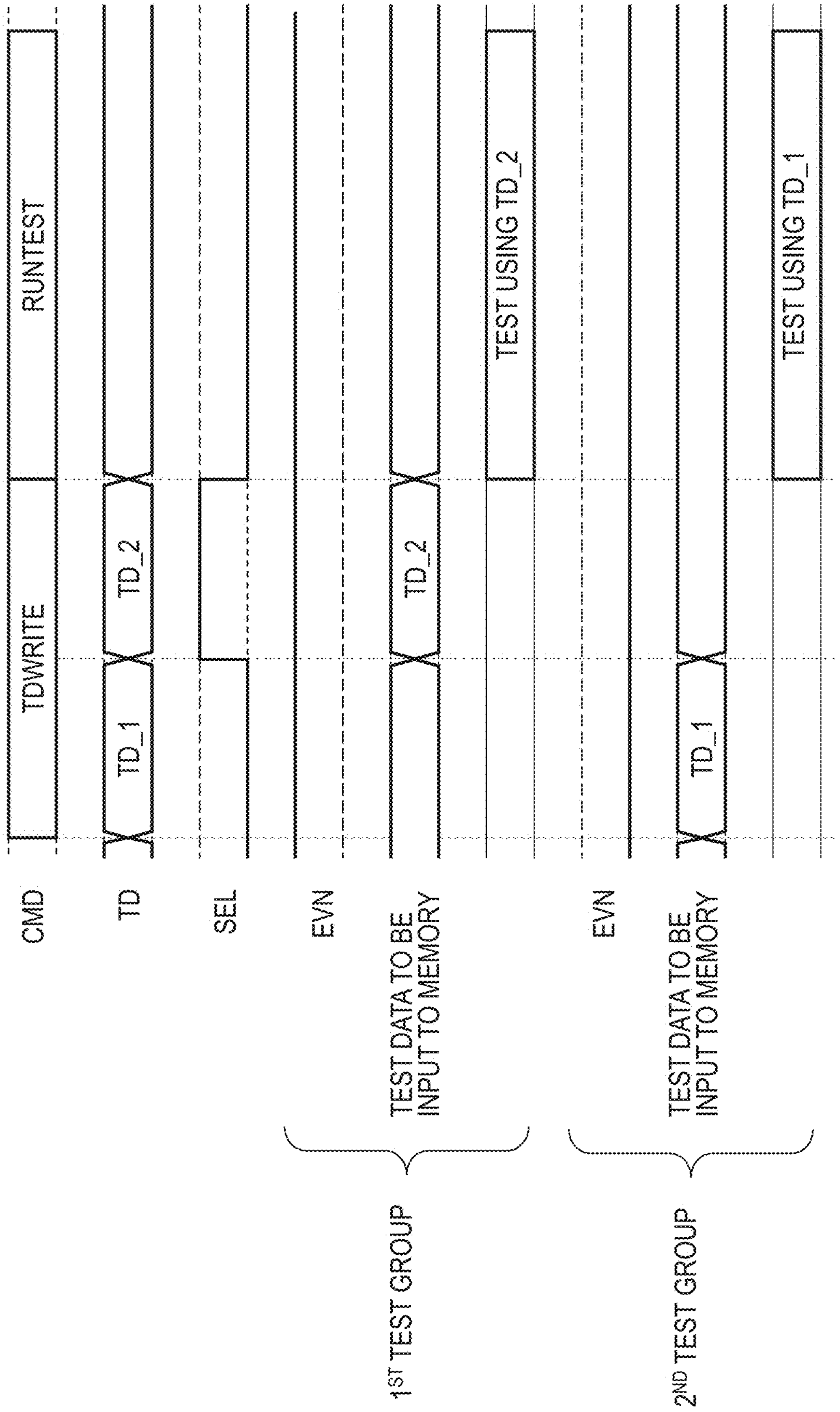
FIG. 4 is a timing diagram illustrating an exemplary test performed by the semiconductor device testing apparatus according to the first embodiment.

FIG. 4 is a timing diagram of a test performed subsequent to the test shown in FIG. 3. The test controller 30 outputs TDWRITE command, the test data TD including the first test data TD_1 and the second test data TD_2, and a test data select signal SEL. In FIG. 4, the test data select signal SEL output from the test controller 30 indicates low level during a period in which the first test data TD_1 is output and indicates high level during a period in which the second test data TD_2 is output.

Therefore, the second test data TD_2 is written in the memory 102 of each semiconductor device 100 of the first test group, and the first test data TD_1 is written in the memory 102 of each semiconductor device 100 in the second test group. Subsequently, in response to RUNTEST command issued from the test controller 30, each semiconductor device 100 of the first test group executes the test with the second test data TD_2, and each semiconductor device 100 of the second test group executes the test with the first test data TD_1.

Following the test illustrated in FIG. 3, by performing the test illustrated in FIG. 4, all the semiconductor devices 100 mounted on the test board 10 perform the test with the test data TD including the first test data TD_1 and the second test data TD_2.

As described above, the semiconductor device 100 selects the test data to be loaded into the memory 102 based on the test group identification signal EVN and the test data select signal SEL. In other words, according to the test program, even if the same test data TD is transferred to all the semiconductor devices 100 mounted on the test board 10, the test data to be loaded into the semiconductor device is selected. Therefore, it is possible to simultaneously perform a test using a test item having a large current consumption and a test using a test item having a small current consumption. As a result, it is possible to suppress the total current consumption when testing a plurality of semiconductor devices 100 at the same time. In other words, the number of devices that can be tested at the same time is not limited by the test items that consume the greatest current.

As mentioned above, in order to increase the number of devices that can be tested at the same time, the current consumption by the test must not exceed the current supplied by the semiconductor device testing apparatus. In order to reduce the current consumption, test data in which the activation rate of the internal circuits is reduced may be generated. However, testing with test data having a reduced activation rate of the internal circuits causes an increase in test time. On the other hand, according to present embodiment, such a time-increase is also avoided. In addition, the number of semiconductor devices that can be simultaneously tested can be increased within the range of the amount of power supply current that can be supplied by the power supply circuit 40. As a result, a cost reduction related to the test can be achieved.

Furthermore, according to the semiconductor device testing apparatus according to present embodiment, there is no need to instruct a test item for each semiconductor device 100 mounted on the test board 10 individually, such as Patent Document 1. That is, there is no need for preparing a test program that specifies test items for each semiconductor device 100 on the test board 10, and there is no need to improve the semiconductor device testing apparatus so that test items can be specified for each semiconductor device 100 on the test board 10.

Second Embodiment

Figure 5:
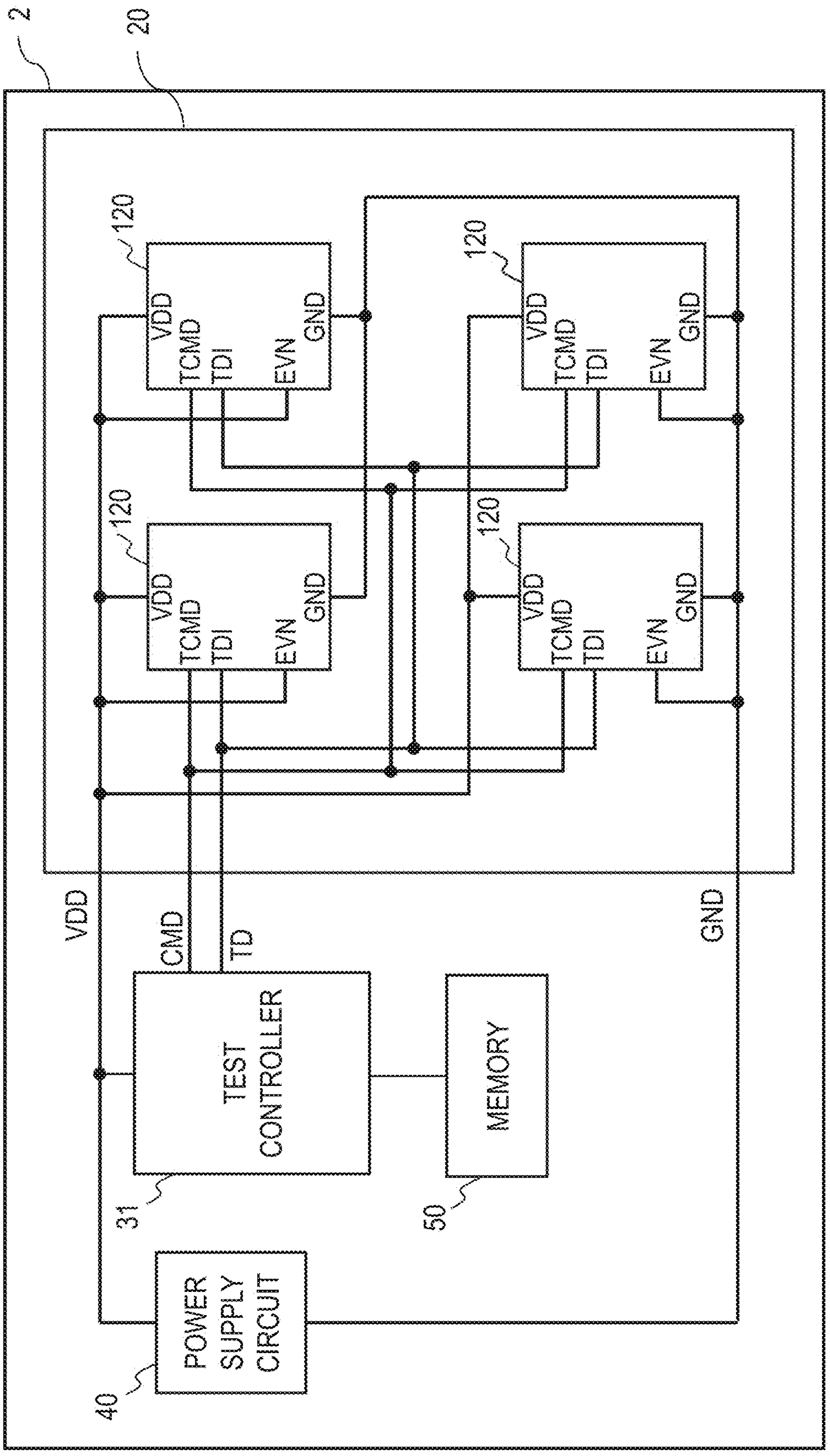
FIG. 5 is a diagram illustrating an exemplary configuration of a semiconductor device testing apparatus according to a second embodiment.
Figure 6:
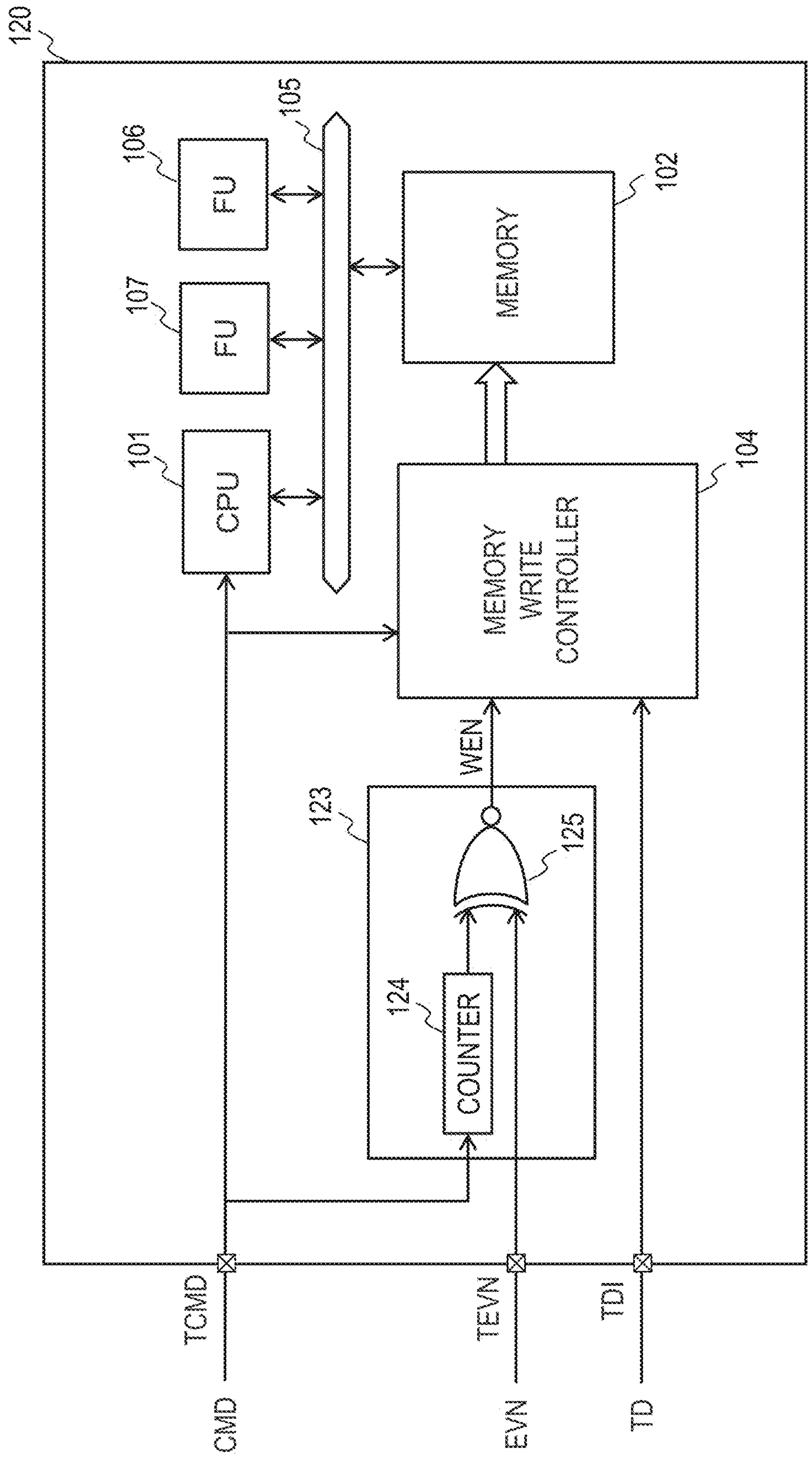
FIG. 6 is a block diagram illustrating a configuration example of a semiconductor device.

A semiconductor device testing apparatus according to a second embodiment will be described. FIG. 5 is a diagram illustrating an exemplary configuration of a semiconductor device testing apparatus 2 in the second embodiment. FIG. 6 is a diagram showing a configuration of a device under test (semiconductor device) 120 of the semiconductor device testing apparatus 2 according to the second embodiment. Of the configurations shown in FIG. 5, configurations having the same functions as those shown in FIG. 1 are denoted by the same reference numerals, and description thereof will be omitted. Similarly, among the configurations illustrated in FIG. 6, configurations having the same functions as those illustrated in FIG. 2 are denoted by the same reference numerals, and description thereof will be omitted.

The second embodiment differs from the first embodiment in that the test controller 31 does not provide the test data select signal SEL. Therefore, the test board 20 differs from the test board of the first embodiment in that it does not include wirings for transmitting the test data select signal SEL to the semiconductor devices 120. In addition, the semiconductor device 120 according to the second embodiment is a semiconductor device like the semiconductor device 100 according to first embodiment, and is, for example, a MCU. As illustrated in FIG. 6, the semiconductor device 120 includes a test data input control circuit 123 that is another form of the test data input control circuit 103 illustrated in FIG. 2. The semiconductor device 120 according to the second embodiment includes a first functional circuit block 106 and a second functional circuit block 107 in addition to the configuration shown in FIG. 2. The first functional circuit block 106 and the second functional circuit block 107 are peripheral circuits for realizing functions as MCU, such as an analog-to-digital converter circuit and a DMA controller.

As shown in FIG. 6, the test data input control circuit 123 includes a counter 124 and a comparator 125. The counter 124 counts the number of times TDWRITE command outputted from the test controller 31 is inputted to the semiconductor device 120. The comparator 125 compares the output of the counter 124 with the test group identification signal EVN, and outputs the comparison result as a test data write enable signal WEN. The comparator 125 asserts the test data write enable signal WEN as an output when the output of the counter 124 and the test group identification signal EVN coincide with each other and negates the test data write enable signal WEN when the output of the counter 124 and the test group identification signal EVN do not coincide with each other. The comparator 125 includes, for example, an Exclusive-NOR circuit.

The counter 124 is, for example, a quaternary counter which outputs a count value in 2 bits. The comparator 125 receives the value of the upper bit of the count value by the counter 124. That is, in response to the first TDWRITE command, the count value of the counter 124 indicates "1", so that the upper bit "0" is inputted to the comparator 125. Then, in response to the second TDWRITE command following the first TDWRITE command, the count value of the counter 124 indicates "2", so that the upper bit "1" is inputted to the comparator 125. Similarly, in response to the third TDWRITE command, the count value of the counter 124 indicates "3", and the upper bit "1" is inputted to the comparator 125. The count value of the counter 124 indicates "0" in response to the fourth TDWRITE command. The upper bit "0" is inputted to the comparator 125.

Figure 7:
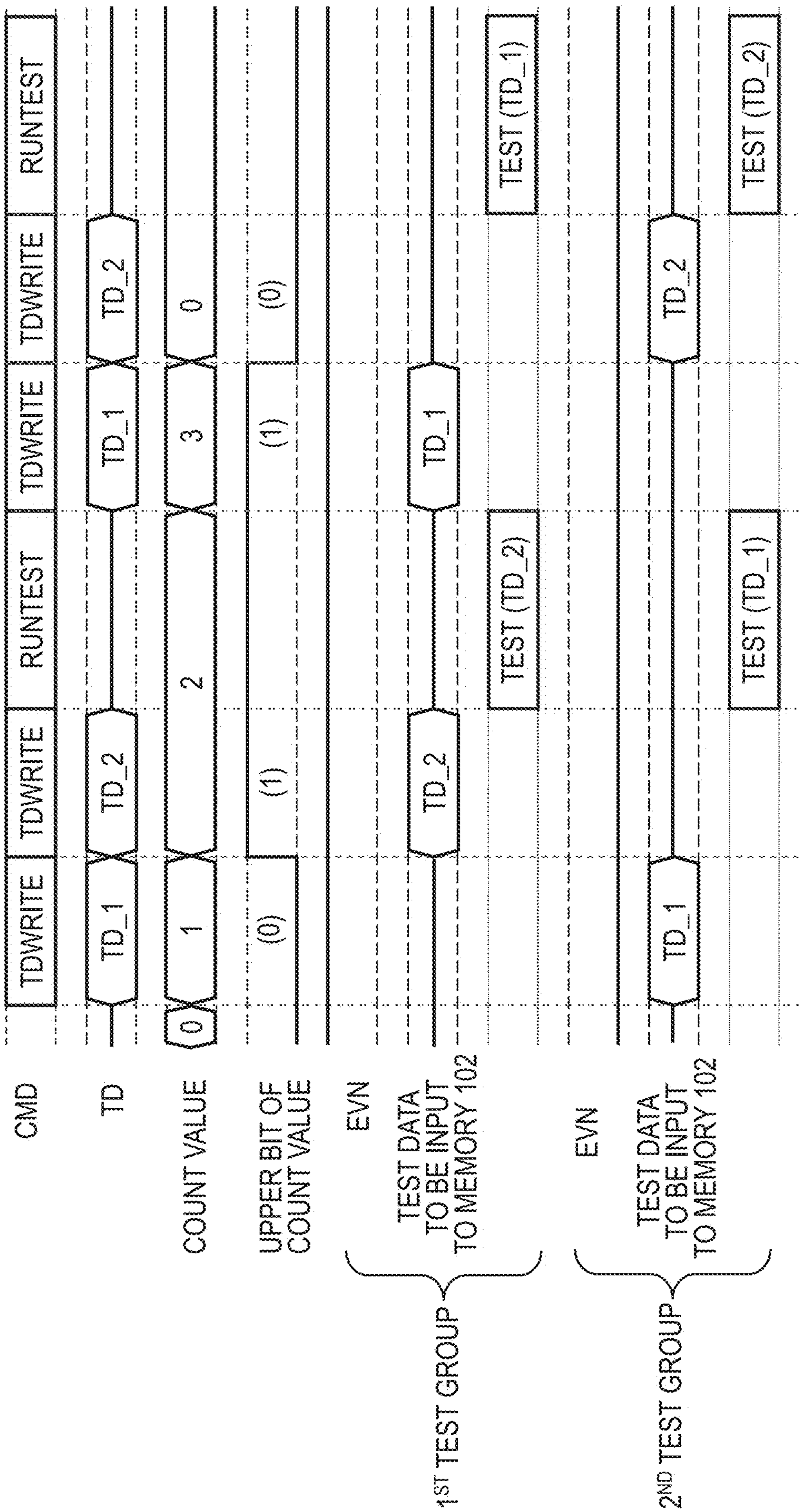
FIG. 7 is a timing diagram illustrating an exemplary test performed by the semiconductor device testing apparatus according to the second embodiment.

FIG. 7 is a timing diagram of an exemplary test performed by the semiconductor device testing apparatus 2 according to the second embodiment. In the second embodiment, the test controller 31 issues test commands in accordance with the test program.

First, the test controller 31 writes test data TD_1 for testing of the first functional circuit block 106 into the semiconductor device 120 in accordance with the test program. To this end, the test controller 31 outputs TDWRITE command and the test data TD_1 toward the test board 20. The test data TD_1 is a set of test data for testing the first functional circuit block 106. The semiconductor device 120 receives TDWRITE command and the test data TD_1 via the test board 20. The counter 124 in the semiconductor device 120 has a count value of "1" in response to the TDWRITE command for testing the first functional circuit block 106, and the upper bit indicates "0". As a result, in each semiconductor device 120 of the second test group whose the test group identification terminal TEVN is fixed to low level on the test board 20, the test data write enable signal WEN is asserted. Therefore, the test data TD_1 for testing of the first functional circuit block 106 is written to each semiconductor device 120 of the second test group and is not written to the semiconductor devices 120 of the first test group.

Next, the test controller 31 writes the test data TD_2 for testing of the second functional circuit block 107 into the semiconductor device 120. To this end, the test controller 31 outputs TDWRITE command and the test data TD_2 toward the test board 20. The test data TD_2 is a set of test data for testing the second functional circuit block 107. The count value of the counter 124 in the semiconductor device 120 indicates "2", and the upper bit thereof indicates "1". Therefore, in each semiconductor device 120 of the first test group whose the test group identification terminal TEVN is fixed to high level on the test board 20, the test data write enable signal WEN is asserted. Accordingly, the test data related to the test of the second functional circuit block is written to each semiconductor device 120 of the first test group and is not written to the semiconductor devices 120 of the second test group.

Subsequently, the test controller 31 sends RUNTEST command to all the semiconductor devices 120 on the test board 20 via the test board 20. In response to RUNTEST command, each semiconductor device 120 executes the test with the test data written in its own memory 102.

As described above, the counter 124 in the semiconductor device 120 counts number of times TDWRITE command are inputted, and the upper bit of the count value can be regarded as the same function of the test data select signal SEL in the first embodiment. Therefore, according to the present second embodiment, substantially the similar effects as those of the first embodiment can be obtained. In addition, according to the second embodiment, it is possible to reduce the number of dedicated terminals for testing compared to the first embodiment. Each semiconductor device 120 can selectively capture test data by using TDWRITE command which is a test data write command. Furthermore, since the test data select signal SEL is no longer required to be transferred to the semiconductor devices 120, the number of wirings on the test board 20 can be reduced as compared with the first embodiment.

In second embodiment, the test data write command, TDWRITE command, is counted, but the present invention is not limited thereto. For example, the test data TD is stored in a predetermined storage area of the memory 102. Therefore, the number of times the start address of the predetermined storage area is generated in response to TDWRITE command may be counted, and the test data write enable signal WEN may be generated by the count value and the test group identifying signal EVN.

The semiconductor device testing apparatus according to the first and the second embodiment is not particularly limited, but is, for example, a burn-in test apparatus.

Although the invention made by the present inventor has been specifically described based on the embodiment, the present invention is not limited to the embodiment described above, and it is needless to say that various modifications can be made without departing from the gist thereof.

What is claimed is:

1. A semiconductor device testing apparatus simultaneously testing a plurality of semiconductor devices, the semiconductor device testing apparatus comprising:

a test board mounting the semiconductor devices;

a test memory storing a test program;

a test controller configured to execute the test program to generate test signals used for test of the semiconductor devices mounted on the test board; and a power supply circuit supplying power supply for the semiconductor devices, wherein the semiconductor devices mounted on the test board are divided into a first test group and a second test group, each of the semiconductor devices includes:

a central processing unit (CPU);

a memory;

a test data input terminal receiving test data;

a test group identification terminal receiving a test group identification signal;

a test data input control circuit receiving the test group identification signal through the test group identification terminal and generating a memory write enable signal for allowing the test data to be written into the memory based on the test group identification signal; and a memory write control circuit generating test data write address and selecting the test data received through the test data input terminal based on the memory write enable signal to transfer the test data selected and the test data write address to the memory, and wherein the test group identification terminals of the semiconductor devices of the first test group are fixed to high level on the test board and the test group identification terminals of the semiconductor devices of the second test group are fixed to low level on the test board.

2. The semiconductor device according to claim 1, wherein the test controller further generates and outputs a test data select signal to the semiconductor devices mounted on the test board, and wherein the test data input control circuit comprises an Exclusive-NOR circuit inputted the test data select signal and the test group identification signal.

3. The semiconductor device according to claim 1, wherein the test controller generates a test data write command according to the test program for the semiconductor devices on the test board, and wherein the test data input control unit includes a counter which counts a number of times a test data write command is input, and generates the memory write enable signal based on an output of the counter and the test group identification signal.

4. A semiconductor device testing method using a semiconductor device testing apparatus simultaneously testing a plurality of semiconductor devices, the method comprising:

transferring a plurality of test data sets associated with a plurality of test items to a plurality of semiconductor devices mounted on a test board from a test controller;

storing a first test data set of the plurality of test data sets into a first test group of the plurality of semiconductor devices through the test board;

storing a second test data set of the plurality of test data sets into a second test group of the plurality of semiconductor devices through the test board; and performing a test operation, based on a test execution command, on the first test group of the plurality of semiconductor devices with the first data set and on the second test group of the plurality of semiconductor devices with the second data set in parallel.

5. The method according to claim 4, wherein each of the plurality of semiconductor devices includes a test group identification terminal which is connected to a ground or a power supply on the test board.

* * * * *